(12) United States Patent
Xie et al.

(10) Patent No.: US 10,553,762 B2
(45) Date of Patent: Feb. 4, 2020

(54) LIGHT EMITTING DIODE CHIP WITH PROTECTIVE LAYER OF METAL CATALYST AND FLUORINATED GRAPHENE AND PREPARATION METHOD THEREOF

(71) Applicant: HC SEMITEK CORPORATION, Wuhan (CN)

(72) Inventors: Peng Xie, Wuhan (CN); Lingfeng Yin, Wuhan (CN); Tao Han, Wuhan (CN); Jiangbo Wang, Wuhan (CN); Peng Li, Wuhan (CN)

(73) Assignee: HC SEMITEK CORPORATION, Wuhan (CN)

( * ) Notice: Subject to any disclaimer, the term of this patent is extended or adjusted under 35 U.S.C. 154(b) by 0 days.

(21) Appl. No.: 15/719,603

(22) Filed: Sep. 29, 2017

(65) Prior Publication Data

US 2018/0026164 A1    Jan. 25, 2018

Related U.S. Application Data

(63) Continuation-in-part of application No. PCT/CN2016/077758, filed on Mar. 29, 2016.

(30) Foreign Application Priority Data

Mar. 30, 2015   (CN) .......................... 2015 1 0142755

(51) Int. Cl.
*H01L 33/44*   (2010.01)
*H01L 33/00*   (2010.01)
*H01L 33/56*   (2010.01)
*H01L 33/64*   (2010.01)

(52) U.S. Cl.
CPC ............ *H01L 33/44* (2013.01); *H01L 33/005* (2013.01); *H01L 33/56* (2013.01); *H01L 33/641* (2013.01); *H01L 2933/005* (2013.01); *H01L 2933/0025* (2013.01); *H01L 2933/0075* (2013.01)

(58) Field of Classification Search
None
See application file for complete search history.

(56) References Cited

FOREIGN PATENT DOCUMENTS

CN            104810436 A   *  7/2015   ............. H01L 33/00

OTHER PUBLICATIONS

CN104810436A, Pub: Jul. 29, 2015, Machine Translation (Year: 2015).*

* cited by examiner

*Primary Examiner* — Andres Munoz
(74) *Attorney, Agent, or Firm* — Matthias Scholl, PC; Matthias Scholl

(57) ABSTRACT

A method for preparing a light emitting diode chip, the method including: 1) providing a substrate; 2) growing an n-type semiconductor layer, an active layer and a p-type semiconductor layer on the substrate sequentially in that order; 3) forming a step including an upper horizontal end surface, a lower horizontal end surface and a step surface in the n-type semiconductor layer, the active layer and the p-type semiconductor layer; 4) growing a transparent conductive layer on the upper horizontal end surface, and forming an etching hole in the middle of the transparent conductive layer; 5) forming an N electrode on the lower horizontal end surface, and forming a P electrode in the etching hole; 6) growing a metal catalyst layer on the light emitting diode chip; and 7) forming a fluorinated graphene protective layer on the metal catalyst layer.

5 Claims, 3 Drawing Sheets

LIGHT EMITTING DIODE CHIP WITH PROTECTIVE LAYER OF METAL CATALYST AND FLUORINATED GRAPHENE AND PREPARATION METHOD THEREOF

CROSS-REFERENCE TO RELATED APPLICATIONS

This application is a continuation-in-part of International Patent Application No. PCT/CN2016/077758 with an international filing date of Mar. 29, 2016, designating the United States, now pending, and further claims foreign priority to Chinese Patent Application No. 201510142755.X filed Mar. 30, 2015. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, and Cambridge, Mass. 02142.

BACKGROUND OF THE INVENTION

Field of the Invention

The invention relates to the field of light emitting diodes, and more particularly relates to a light emitting diode chip and a preparation method thereof.

Description of the Related Art

Typically, the most widely used light emitting diode chip includes a substrate layer, an n-type semiconductor layer, an active layer and a p-type semiconductor layer which are sequentially laminated on the substrate. A step is formed by etching the n-type semiconductor layer, the active layer and the p-type semiconductor layer. The upper horizontal end surface of the step has a transparent conducting layer and p electrode provided thereon, and the lower horizontal end surface of the step has an N electrode provided thereon. The step is covered with a protective layer.

The existing protective layer is mainly composed of silica, which result in that the water proof property and the heat dissipation property of the protective layer are not ideal.

SUMMARY OF THE INVENTION

In view of the above-described problems, it is one objective of the invention to provide a light emitting diode chip and a preparation method thereof. The light emitting diode chip prepared using the method of the present disclosure features improved water proof property and heat dissipation property.

To achieve the above objective, in accordance with one embodiment of the invention, there is provided a method for preparing a light emitting diode chip, the method comprising:

providing a substrate;

growing an n-type semiconductor layer, an active layer and a p-type semiconductor layer on the substrate sequentially in that order;

forming a step comprising an upper horizontal end surface, a lower horizontal end surface and a step surface connecting the upper horizontal end surface and the lower horizontal end surface in the n-type semiconductor layer, the active layer and the p-type semiconductor layer;

growing a transparent conductive layer on the upper horizontal end surface, and forming an etching hole in the middle of the transparent conductive layer;

forming an N electrode on the lower horizontal end surface, and forming a P electrode in the etching hole;

growing a metal catalyst layer on the light emitting diode chip with the N electrode and the P electrode formed thereon, the metal catalyst layer covering an area other than central areas of the top surfaces of the N electrode and the P electrode and other than the step surface on the surface of the light emitting diode chip; and forming a fluorinated graphene protective layer on the metal catalyst layer.

In a class of this embodiment, growing a metal catalyst layer on the light emitting diode chip with the N electrode and the P electrode formed thereon, comprises:

coating a layer of photoresist in the central areas of the top surfaces of the N electrode and the P electrode and on the step surface;

depositing a layer of metallic on the surface of the light emitting diode chip with the N electrode and the P electrode formed thereon by a magnetron sputtering method, a thermal evaporation method, a solution method or an electronic beam evaporation method; and removing the metal in the central areas of the top surfaces of the N electrode and the P electrode and the metal on the step surface by a negative adhesive stripping method, and removing the photoresist so as to form the metal catalyst layer.

In a class of this embodiment, the metal catalyst layer is made of Nickel (Ni), Indium (In), Titanium (Ti), Rhodium (Rh) or Zinc (Zn); or the metal catalyst layer is made of an alloy comprising at least two of Nickel (Ni), Indium (In), Titanium (Ti), Rhodium (Rh) or Zinc (Zn); or the metal catalyst layer is formed by a metal organic source (MO source) which comprises Nickel (Ni), Indium (In), Titanium (Ti), Rhodium (Rh) or Zinc (Zn).

In a class of this embodiment, the metal catalyst layer has a thickness of 1-15 nm.

In a class of this embodiment, forming a fluorinated graphene protective layer on the metal catalyst layer comprises:

placing the light emitting diode chip on which the metal catalyst layer is formed into a surface wave plasma chemical vapor deposition chamber; and passing $H_2$, $CH_4$ and $F_2$ and starting the microwave source for 5-20 min with the pressure being controlled below 1000Pa and the temperature being controlled between 500-750° C. in the surface wave plasma chemical vapor deposition chamber to form the fluorinated graphene protective layer on the surface of the light emitting diode chip.

In a class of this embodiment, the thickness of the fluorinated graphene protective layer is equal to the thickness of 1-10 layers of monatomic fluorinated graphene.

According to another aspect, one embodiment of the invention provides a light emitting diode chip comprising a substrate, and an n-type semiconductor layer, an active layer and a p-type semiconductor layer sequentially laminated on the substrate. A step is formed in the n-type semiconductor layer, the active layer and the p-type semiconductor layer by etching. The step comprises an upper horizontal end surface, a lower horizontal end surface and a step surface connecting the upper horizontal end surface and the lower horizontal end surface. An N electrode is formed on the lower horizontal end surface. The upper horizontal end surface is covered with a transparent conductive layer. An etching hole is formed in the middle of the transparent conductive layer. A P electrode is formed in the etching hole.

In a class of this embodiment, the light emitting diode chip further comprises a metal catalyst layer covering an area other than central areas of the top surfaces of the N electrode and the P electrode and other than the step surface on the surface of the light emitting diode chip and a fluorinated graphene protective layer covering the metal catalyst layer.

In a class of this embodiment, the metal catalyst layer is made of Ni, In, Ti, Rh or Zn; or the metal catalyst layer is made of an alloy comprising at least two of Ni, In, Ti, Rh and Zn; or the metal catalyst layer is formed by a metal organic source which comprises Ni, In, Ti, Rh or Zn.

In a class of this embodiment, the metal catalyst layer has a thickness of 1-15 nm.

In a class of this embodiment, the thickness of the fluorinated graphene protective layer is equal to the thickness of 1-10 layers of monatomic fluorinated graphene.

The solution of the embodiments of the invention can brings the following advantage.

The metal catalyst layer and the fluorinated graphene which are grown on the light emitting diode chip with the N electrode and the P electrode formed thereon form a protective layer of the whole chip. The protective layer covers the area other than central areas of the top surfaces of the N electrode and the P electrode and other than the step surface, that is to say, only the central area of the top surface of the N electrode, the central area of the top surface of the P electrode and the step surface are exposed, such that the protective area of the protective layer for the entire chip is sufficiently large. The water proof effect of the protective layer is good because the fluorinated graphene is impermeable to water. The metal and the fluorinated graphene have high thermal conductivity and good heat-conducting property, so the protective layer can help the chip to dissipate heat at work. Therefore, the above-mentioned chip using the metal catalyst layer and the fluorinated graphene as the protective layer has good water proof property and heat dissipation property.

DETAILED DESCRIPTION OF THE EMBODIMENTS

The objects, features and advantages of the present invention will become more apparent from the following description of embodiments of the present invention when taken in conjunction with the accompanying drawings.

Figure 1:
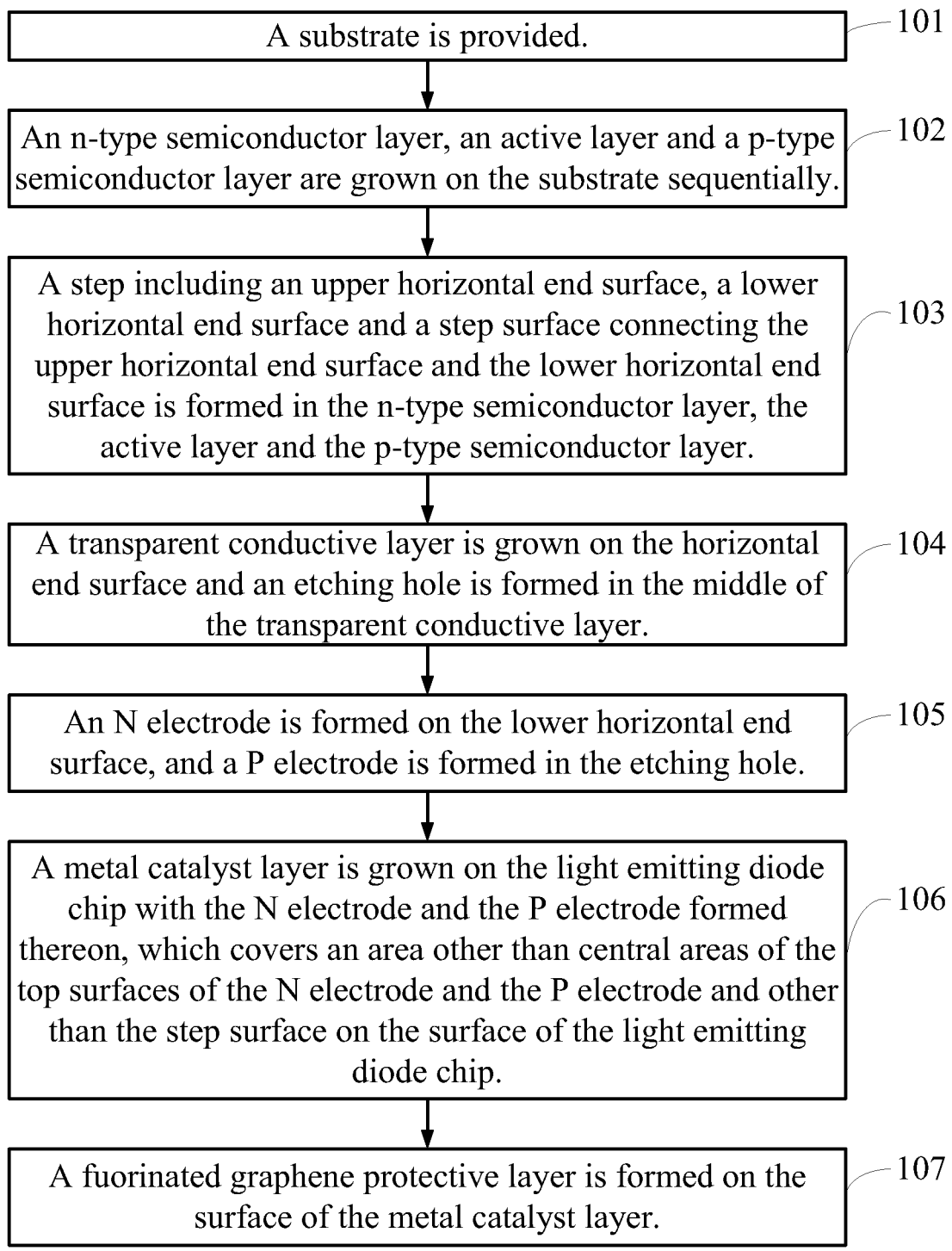
FIG. 1 is a flow chart illustrating a preparation method of a light emitting diode chip according to an embodiment of the invention.

FIG. 1 shows a flow chart illustrating a preparation method of a light emitting diode chip. Referring to FIG. 1, the preparation method comprises:

Step 101: A substrate is provided.

In the embodiment, the substrate comprises but not limited to a sapphire substrate or a silicon substrate.

Step 102: An n-type semiconductor layer, an active layer and a p-type semiconductor layer are grown on the substrate sequentially.

In the embodiment, the n-type semiconductor layer, the active layer and the p-type semiconductor layer is sequentially grown on the substrate by MOCVD (metal-organic chemical vapor deposition).

Further, prior to Step 102, at least a buffer layer is grown on the substrate so as to better grow the subsequent structure.

Step 103: A step comprising an upper horizontal end surface, a lower horizontal end surface and a step surface connecting the upper horizontal end surface and the lower horizontal end surface is formed in the n-type semiconductor layer, the active layer and the p-type semiconductor layer.

In the embodiment, the step is formed in the n-type semiconductor layer, the active layer and the p-type semiconductor layer by an ICP (Inductively Coupled Plasma) etching process. Specifically, a part of the n-type semiconductor layer, the active layer and the p-type semiconductor layer are removed from the n-type semiconductor layer, the active layer and the p-type semiconductor layer sequentially laminated on the substrate by the ICP etching process so as to form the step. The height of the step is larger than the sum of the thicknesses of the p-type semiconductor layer and the active layer, and smaller than the sum of the thicknesses of n-type semiconductor layer, the active layer and the p-type semiconductor layer. That is to say, when the step is etched, the p-type semiconductor layer is etched completely, and then the active layer is etched completely and finally a part of the n-type semiconductor layer is etched.

The upper horizontal end surface is the surface of the unetched p-type semiconductor layer. The lower horizontal end surface is the surface of the n-type semiconductor layer which is formed by etching. And the step surface is a cross-section of the n-type semiconductor layer, the active layer and the p-type semiconductor.

Step 104: A transparent conductive layer is grown on the horizontal end surface and an etching hole is formed in the middle of the transparent conductive layer.

In the embodiment, the transparent conductive layer is an ITO (Indium Tin Oxide) film. The transparent conductive layer is prepared by an electronic beam evaporation method or a magnetic control sputtering method. For example, the electronic beam evaporation method is used to evaporate a transparent conductive layer on the upper horizontal end surface of the step.

Step 105: An N electrode is formed on the lower horizontal end surface, and a P electrode is formed in the etching hole.

In the embodiment, the N electrode and the P electrode is prepared by a thermal evaporation method.

The P electrode is formed on the p-type semiconductor layer.

Step 106: A metal catalyst layer is grown on the light emitting diode chip with the N electrode and the P electrode formed thereon, which covers an area other than central areas of the top surfaces of the N electrode and the P electrode and other than the step surface on the surface of the light emitting diode chip.

In particular, Step 106 is implemented in the following manner:

coating a layer of photoresist on the central area of the top surfaces of the N electrode and the P electrode and on the step surface;

depositing a layer of metallic on the surface of the light emitting diode chip with the N electrode and the P electrode formed thereon by a magnetron sputtering method, a thermal evaporation method, a solution method or an electronic beam evaporation method; and removing the metal in the central area of the top surfaces of the N electrode and the P electrode and the metal on the step surface by a negative adhesive stripping method, and removing the photoresist so as to form the metal catalyst layer. Specifically, it is possible to use a blue film to peel off the metal on the photoresist in the central area of the top surface of the N electrode and in the central area of the top surface of the P electrode.

The way to apply the photoresist is spin-coating. Applying the photoresist by spin-coating can make the photoresist is even, and the thickness of the photoresist can be controlled easily through controlling the spin coating rotate speed. Of course, the embodiments of the invention are not limited to this.

In the embodiments of the invention, the metal catalyst layer is made of Ni, In, Ti, Rh or Zn; or the metal catalyst layer is made of an alloy comprising at least two of Ni, In, Ti, Rh and Zn; or the metal catalyst layer is formed by a metal organic source which comprises Ni, In, Ti, Rh or Zn, such as trimethylindium (TMIn). The material of the metal catalyst layer mentioned above is merely an example. The metal material in the embodiment of the present invention also can be composed of other metal materials, and the present invention is not limited thereto.

Preferably, the metal catalyst layer may have a thickness of 1-15 nm. The thickness of the metal catalyst layer cannot be too thick or too thin. If the metal catalyst layer is too thick, the metal catalyst layer will have strong light absorption ability. And if the metal catalyst layer is too thin, the catalyst effect will be not ideal, which cannot guarantee the normal growth of the subsequent fluorinated graphene protective layer. So the use of the metal catalyst layer with the above-mentioned thickness can make the thickness of the metal catalyst layer is small and make the light transmittance good. And the fluorinated graphene has a very high transmittance in the visible light band so that the overall transparency of the chip is good. In addition, the metal catalyst layer with the above-mentioned thickness also can ensure the catalytic effect of the metal catalyst layer.

Step 107: A fluorinated graphene protective layer is formed on the surface of the metal catalyst layer.

Specifically, Step 107 is implemented in the following manner. Place the light emitting diode chip on which the metal catalyst layer is formed in a surface wave plasma chemical vapor deposition chamber. Pass $H_2$, $CH_4$ and $F_2$ and start the microwave source for 5-20 min with the pressure in the chamber being controlled below 1000 Pa and the temperature in the chamber being controlled between 500-750° C. to form the fluorinated graphene protective layer on the surface of the light emitting diode chip. The pressure in the chamber is preferably 300-600 Pa. $H_2$, $CH_4$ and $F_2$ are passed into the chamber at 2:4:1. The above-mentioned gas ratio is only a preferable value, and the embodiment of the present invention is not limited thereto.

Because the action of the metal catalyst layer is to make the fluorinated graphene can grow at a low temperature, the fluorinated graphene protective layer only grows on the surface of the metal catalyst layer in the above-described growth environment.

In some embodiments of the invention, the thickness of the fluorinated graphene protective layer is equal to the thickness of 1-10 layers of monatomic fluorinated graphene. The thickness of the fluorinated graphene protective layer cannot be too thick or too thin. If the fluorinated graphene protective layer is too thick, the fluorinated graphene protective layer will have a poor light transmission property, thus affecting the normal light emitting of the chip. And if the fluorinated graphene protective layer is too thin, the water proof property will not be good. Therefore, the use of the fluorinated graphene protective layer with the above-mentioned thickness can not only avoid affecting the normal light emitting of the chip, but also ensure that the fluorinated graphene protective layer has a good waterproof performance.

Preferably, the thickness of the fluorinated graphene protective layer is equal to the thickness of 5 layers of monatomic fluorinated graphene.

The metal catalyst layer and the fluorinated graphene which are grown on the light emitting diode chip with the N electrode and the P electrode formed thereon form a protective layer of the whole chip. The protective layer covers the area other than central areas of the top surfaces of the N electrode and the P electrode and other than the step surface, that is to say, only the central area of the top surface of the N electrode, the central area of the top surface of the P electrode and the step surface are exposed, such that the protective area of the protective layer for the entire chip is sufficiently large. The water proof effect of the protective layer is good because the fluorinated graphene is impermeable to water. The metal and the fluorinated graphene have high thermal conductivity and good heat-conducting property, so the protective layer can help the chip to dissipate heat at work. Therefore, the above-mentioned chip using the metal catalyst layer and the fluorinated graphene as the protective layer has good water proof property and heat dissipation property.

Figure 2:
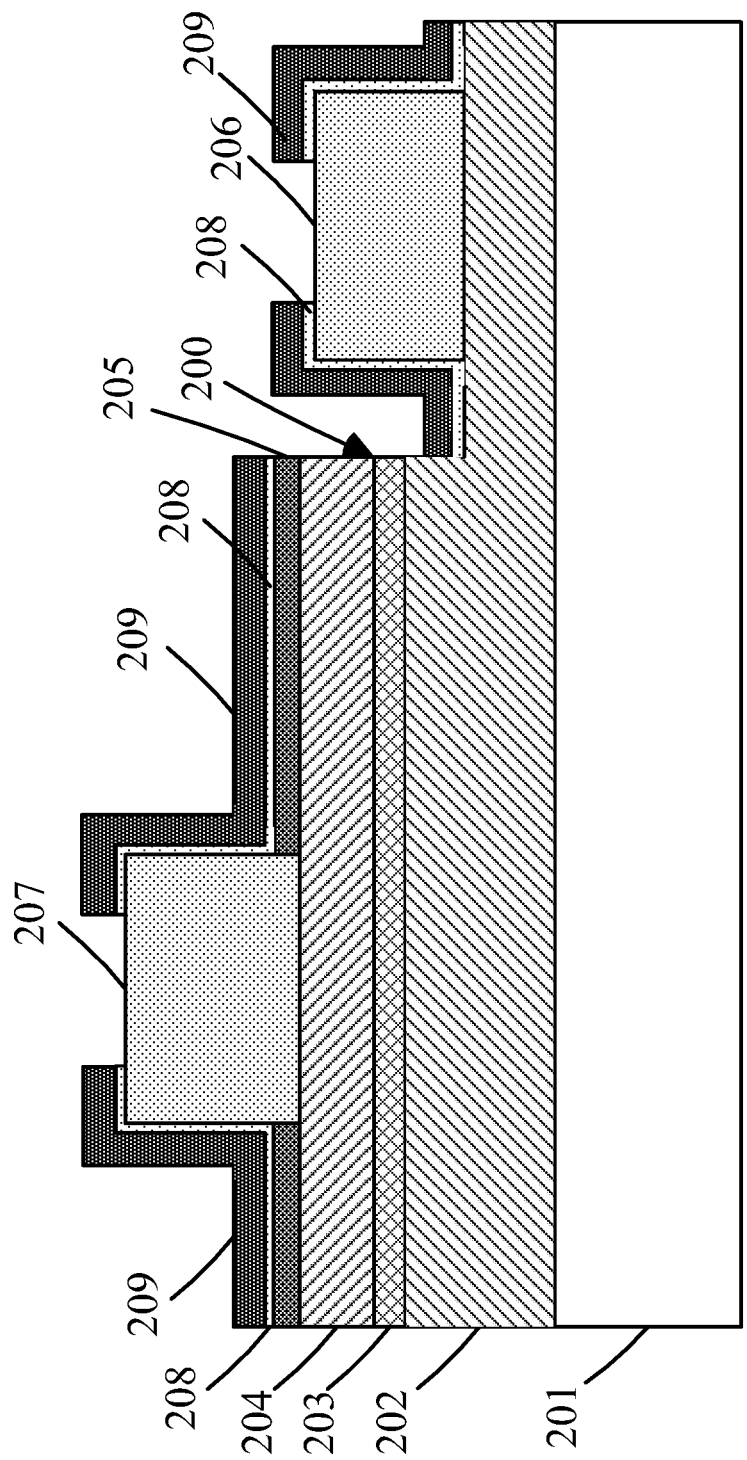
FIG. 2 is a schematic view of a light emitting diode chip according to an embodiment of the invention.

FIG. 2 shows a structure of a light emitting diode chip according to an embodiment of the invention, which is prepared using the preparation method provided by FIG. 1. Referring to FIG. 2, the light emitting diode chip comprises a substrate 201, and an n-type semiconductor layer 202, an active layer 203 and a p-type semiconductor layer 204 sequentially laminated on the substrate 201. A step 200 is formed in the n-type semiconductor layer 202, the active layer 203 and the p-type semiconductor layer 204 by etching. The step 200 comprises an upper horizontal end surface, a lower horizontal end surface and a step surface connecting the upper horizontal end surface and the lower horizontal end surface. An N electrode 206 is formed on the lower horizontal end surface of the step 200. The upper horizontal end surface of the step 200 is covered with a transparent conductive layer 205. An etching hole is formed in the middle of the transparent conductive layer 205. A P electrode 207 is formed in the etching hole of the transparent conductive layer 205.

The light emitting diode chip further comprises a metal catalyst layer 208 and a fluorinated graphene protective layer 209. The metal catalyst layer 208 covers an area other than central areas of the top surfaces of the N electrode 206 and the P electrode 207 and other than the step surface on the surface of the light emitting diode chip. The central areas of the top surfaces of the N electrode 206 and the P electrode 207 are exposed. The fluorinated graphene protective layer 209 covers the metal catalyst layer 208.

Figure 3:
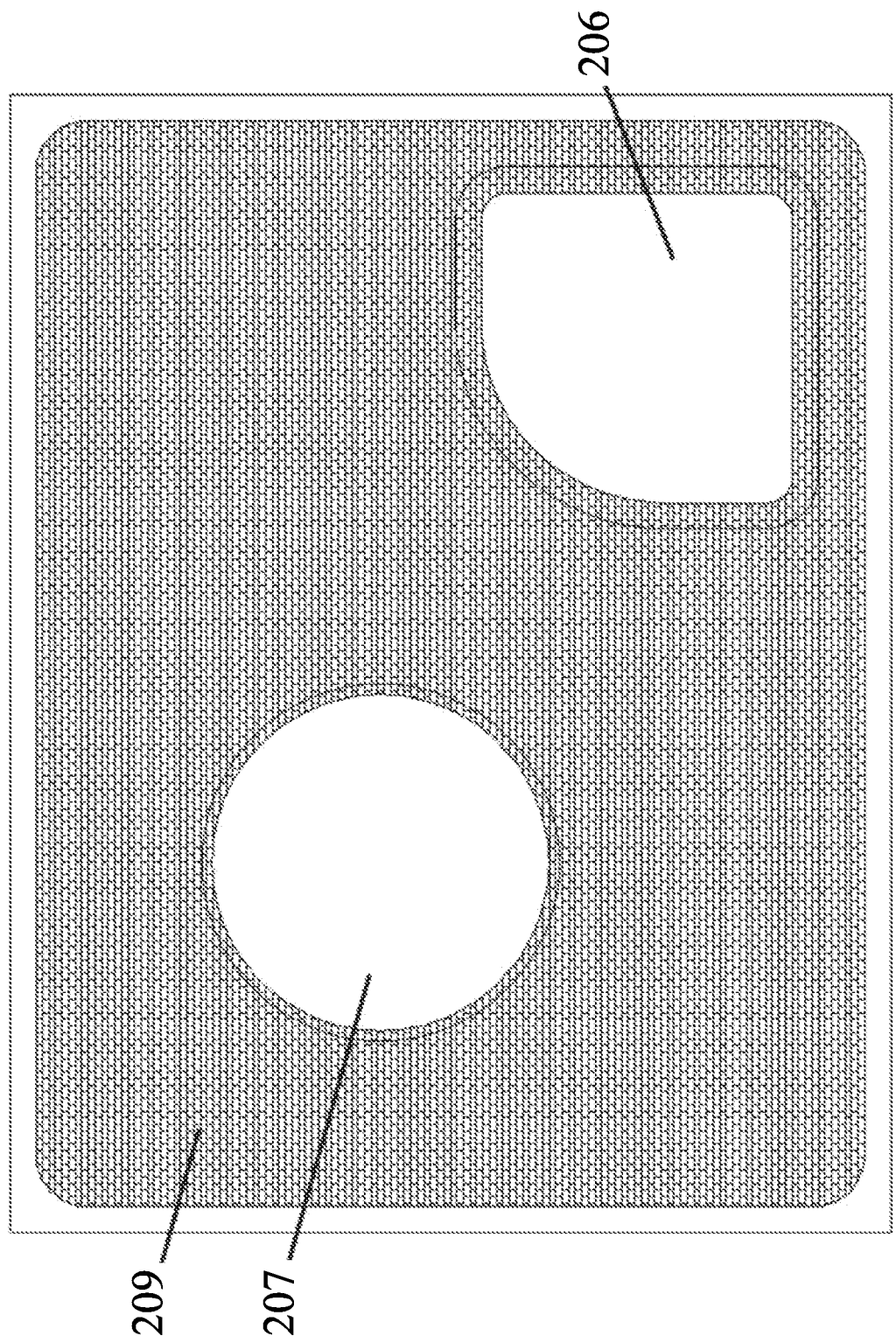
FIG. 3 is a top view of a light emitting diode chip according to an embodiment of the invention.

FIG. 3 is a top view of a light emitting diode chip according to an embodiment of the invention. In FIG. 3, the fluorinated graphene protective layer 209 covers the entire surface of the chip except the central areas of the N electrode 206 and the P electrode 207.

In the embodiments of the invention, the metal catalyst layer is made of Ni, In, Ti, Rh or Zn; or the metal catalyst layer is made of an alloy comprising at least two of Ni, In, Ti, Rh and Zn; or the metal catalyst layer is formed by a metal organic source which comprises Ni, In, Ti, Rh or Zn, such as TMIn. The material of the metal catalyst layer mentioned above is merely an example. The metal material in the embodiment of the present invention also can be composed of other metal materials, and the present invention is not limited thereto.

In the embodiment of the invention, the metal catalyst layer has a thickness of 1-15 nm. The thickness of the metal catalyst layer cannot be too thick or too thin. If the metal catalyst layer is too thick, the metal catalyst layer will have strong light absorption ability. And if the metal catalyst layer is too thin, the catalyst effect will be not ideal, which cannot guarantee the normal growth of the subsequent fluorinated graphene protective layer. So the use of the metal catalyst layer with the above-mentioned thickness can make the thickness of the metal catalyst layer is small and make the light transmittance good. And the fluorinated graphene has a very high transmittance in the visible light band so that the overall transparency of the chip is good. In addition, the metal catalyst layer with the above-mentioned thickness also can ensure the catalytic effect of the metal catalyst layer.

In some embodiments of the invention, the thickness of the fluorinated graphene protective layer is equal to the thickness of 1-10 layers of monatomic fluorinated graphene. The thickness of the fluorinated graphene protective layer ca not be too thick or too thin. If the fluorinated graphene protective layer is too thick, the fluorinated graphene protective layer will have a poor light transmission property, thus affecting the normal light emitting of the chip. And if the fluorinated graphene protective layer is too thin, the water proof property will not be good. Therefore, the use of the fluorinated graphene protective layer with the above-mentioned thickness can not only avoid affecting the normal light emitting of the chip, but also ensure that the fluorinated graphene protective layer has a good waterproof performance.

Preferably, the thickness of the fluorinated graphene protective layer is equal to the thickness of 5 layers of monatomic fluorinated graphene.

The substrate 201 comprises but not limited to a sapphire substrate or a silicon substrate.

The structure of the light emitting diode chip provided in FIG. 2 is only an example of the light emitting diode chip of the present. There are many variations in the order of the layers in the light emitting diode chip, and the light emitting diode chip may also comprise more or fewer layers (for example, a buffer layer is provided between the substrate and the n-type semiconductor layer). As long as the necessary elements of the light-emitting diode chip are prepared to ensure that the light-emitting diode chip can work properly.

The metal catalyst layer and the fluorinated graphene which are grown on the light emitting diode chip with the N electrode and the P electrode formed thereon form a protective layer of the whole chip. The protective layer covers the area other than central areas of the top surfaces of the N electrode and the P electrode and other than the step surface, that is to say, only the central area of the top surface of the N electrode, the central area of the top surface of the P electrode and the step surface are exposed, such that the protective area of the protective layer for the entire chip is sufficiently large. The water proof effect of the protective layer is good because the fluorinated graphene is impermeable to water. The metal and the fluorinated graphene have high thermal conductivity and good heat-conducting property, so the protective layer can help the chip to dissipate heat at work. Therefore, the above-mentioned chip using the metal catalyst layer and the fluorinated graphene as the protective layer has good water proof property and heat dissipation property.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A light emitting diode chip, comprising:
   a substrate;
   an n-type semiconductor layer, an active layer and a p-type semiconductor layer laminated on the substrate sequentially in that order;
   a step formed in the n-type semiconductor layer, the active layer and the p-type semiconductor layer, the step comprising an upper horizontal end surface, a lower horizontal end surface, and a step surface connecting the upper horizontal end surface and the lower horizontal end surface, the lower horizontal end surface comprising an N electrode formed thereon, the upper horizontal end surface being covered with a transparent conductive layer with an etching hole formed in a middle of the transparent conductive layer, and the etching hole comprising a P electrode formed therein; wherein
   the light emitting diode chip further comprises a metal catalyst layer covering areas other than central areas of top surfaces of the N electrode and the P electrode and other than the step surface, and a fluorinated graphene protective layer covering the metal catalyst layer.

2. The light emitting diode chip of claim 1, wherein the metal catalyst layer is made of Nickel (Ni), Indium (In), Titanium (Ti), Rhodium (Rh) or Zinc (Zn); or the metal catalyst layer is made of an alloy comprising at least two of Nickel (Ni), Indium (In), Titanium (Ti), Rhodium (Rh) or Zinc (Zn); or the metal catalyst layer is formed by a metal organic source which comprises Nickel (Ni), Indium (In), Titanium (Ti), Rhodium (Rh) or Zinc (Zn).

3. The light emitting diode chip of claim 1, wherein the metal catalyst layer has a thickness of 1-15 nm.

4. The light emitting diode chip of claim 2, wherein the metal catalyst layer has a thickness of 1-15 nm.

5. The light emitting diode chip of claim 1, wherein a thickness of the fluorinated graphene protective layer is equal to a thickness of 1-10 layers of monatomic fluorinated graphene.

* * * * *